United States Patent
Askin, III et al.

(10) Patent No.: US 12,209,199 B2
(45) Date of Patent: Jan. 28, 2025

(54) INCREASED DEPOSITION EFFICIENCY VIA DUAL REACTOR SYSTEM

(71) Applicant: HZO, Inc., Morrisville, NC (US)

(72) Inventors: Robert Eugene Askin, III, Cary, NC (US); Sean Clancy, Apex, NC (US)

(*) Notice: Subject to any disclaimer, the term of this patent is extended or adjusted under 35 U.S.C. 154(b) by 498 days.

(21) Appl. No.: 17/239,516

(22) Filed: Apr. 23, 2021

(65) Prior Publication Data

US 2021/0332261 A1    Oct. 28, 2021

Related U.S. Application Data

(60) Provisional application No. 63/014,518, filed on Apr. 23, 2020.

(51) Int. Cl.
| | | |
|---|---|---|
| *C09D 165/02* | (2006.01) | |
| *C09D 165/04* | (2006.01) | |
| *C23C 14/12* | (2006.01) | |
| *C23C 16/448* | (2006.01) | |
| *C23C 16/455* | (2006.01) | |

(52) U.S. Cl.
CPC ......... *C09D 165/02* (2013.01); *C09D 165/04* (2013.01); *C23C 14/12* (2013.01); *C23C 16/4488* (2013.01); *C23C 16/45512* (2013.01)

(58) Field of Classification Search
CPC .. C09D 135/02; C09D 165/04; C09D 165/02; B05D 1/08; C23C 14/12; C23C 16/4488; C23C 16/45512; C08G 61/025; C08G 2261/3424
See application file for complete search history.

(56) References Cited

U.S. PATENT DOCUMENTS

| | | | |
|---|---|---|---|
| 2016/0328494 A1* | 11/2016 | Su | C10G 9/20 |
| 2017/0362703 A1* | 12/2017 | Yun | H05K 3/285 |

FOREIGN PATENT DOCUMENTS

| | | | | |
|---|---|---|---|---|
| KR | 20210014002 A | * | 2/2021 | C23C 16/45559 |

OTHER PUBLICATIONS

KR-20210014002-A, KPION machine translation, originally published 2021, p. 1-19 (Year: 2021).*
KR-20210014002-A, EPO machine translation, originally published 2021, p. 1-10 (Year: 2021).*

* cited by examiner

*Primary Examiner* — Katherine A Bareford
*Assistant Examiner* — Christina D McClure
(74) *Attorney, Agent, or Firm* — Intellectual Strategies

(57) ABSTRACT

A method for depositing Parylene onto a substrate includes operating a first pyrolysis chamber at a first set of parameters to cause cracking of dimers into monomers at the first set of parameters and operating a second pyrolysis chamber at a second set of parameters to cause cracking of dimers into monomers at the second set of parameters. The method includes mixing the monomers at the first set of parameters with monomers at the second set of parameters together and polymerizing the mixture as a protective coating.

6 Claims, 6 Drawing Sheets

INCREASED DEPOSITION EFFICIENCY VIA DUAL REACTOR SYSTEM

RELATED APPLICATIONS

This application claims the benefit of U.S. Provisional Patent Application No. 63/014,518, filed Apr. 23, 2020, which is incorporated herein by reference in its entirety.

BACKGROUND

This disclosure relates generally to Parylene deposition systems. More specifically, this disclosure relates to a dual reactor deposition system.

SUMMARY

The subject matter of the present application has been developed in response to the present state of the art, and in particular, in response to the problems and disadvantages associated with conventional deposition that have not yet been fully solved by currently available techniques. Accordingly, the subject matter of the present application has been developed to provide embodiments of a system, an apparatus, and a method that overcome at least some of the shortcomings of prior art techniques.

Disclosed herein is a method for depositing Parylene onto a substrate. The method includes operating a first pyrolysis chamber at a first set of parameters to cause cracking of dimers into monomers at the first set of parameters. The method further includes operating a second pyrolysis chamber at a second set of parameters to cause cracking of dimers into monomers at the second set of parameters. The method further includes mixing the monomers at the first set of parameters with monomers at the second set of parameters together. The method further includes polymerizing the mixture as a protective coating. The preceding subject matter of this paragraph characterizes example 1 of the present disclosure.

The method includes mixing the monomers at the first set of parameters with monomers at the second set of parameters before entering a deposition chamber. The preceding subject matter of this paragraph characterizes example 2 of the present disclosure, wherein example 2 also includes the subject matter according to example 1, above.

The method includes mixing the monomers at the first set of parameters with monomers at the second set of parameters after entering a deposition chamber. The preceding subject matter of this paragraph characterizes example 3 of the present disclosure, wherein example 3 also includes the subject matter according to any one of examples 1-2, above.

The monomers at the first set of parameters are a precursor to a first Parylene and wherein the monomers at the second set of parameters are a precursor to a second Parylene. The preceding subject matter of this paragraph characterizes example 4 of the present disclosure, wherein example 4 also includes the subject matter according to any one of examples 1-3, above.

The monomers at the first set of parameters are a precursor to a first Parylene and wherein the monomers at the second set of parameters are a precursor to a second Parylene, wherein the first Parylene and the second Parylene are different Parylenes. The preceding subject matter of this paragraph characterizes example 5 of the present disclosure, wherein example 5 also includes the subject matter according to any one of examples 1-4, above.

The monomers at the first set of parameters are a precursor to a first Parylene and wherein the monomers at the second set of parameters are a precursor to a second Parylene, wherein the first Parylene and the second Parylene are a same Parylene. The preceding subject matter of this paragraph characterizes example 6 of the present disclosure, wherein example 6 also includes the subject matter according to any one of examples 1-5, above.

The parameters may be any one of temperature, pressure, residence time, concentration of dimer, amount of dimer, type of dimer, flow rate, or type of material, or a combination thereof. The preceding subject matter of this paragraph characterizes example 7 of the present disclosure, wherein example 7 also includes the subject matter according to any one of examples 1-6, above.

The first set of parameters includes a longer residence time than the second set of parameters. The preceding subject matter of this paragraph characterizes example 8 of the present disclosure, wherein example 8 also includes the subject matter according to any one of examples 1-7, above.

The first set of parameters includes a higher pressure than the second set of parameters. The preceding subject matter of this paragraph characterizes example 9 of the present disclosure, wherein example 9 also includes the subject matter according to any one of examples 1-8, above.

Disclosed herein is a method for depositing Parylene onto a substrate. The method includes operating a first pyrolysis chamber at a first set of parameters to cause cracking of dimers into monomers at the first set of parameters. The method further includes operating a second pyrolysis chamber at a second set of parameters to cause cracking of dimers into monomers at the second set of parameters. The method further includes mixing the monomers at the first set of parameters with monomers at the second set of parameters together before entering a deposition chamber. The method further includes polymerizing the mixture as a protective coating in the deposition chamber. The preceding subject matter of this paragraph characterizes example 10 of the present disclosure.

The monomers at the first set of parameters are a precursor to a first Parylene and wherein the monomers at the second set of parameters are a precursor to a second Parylene. The preceding subject matter of this paragraph characterizes example 11 of the present disclosure, wherein example 11 also includes the subject matter according to example 10, above.

The monomers at the first set of parameters are a precursor to a first Parylene and wherein the monomers at the second set of parameters are a precursor to a second Parylene, wherein the first Parylene and the second Parylene are different Parylenes. The preceding subject matter of this paragraph characterizes example 12 of the present disclosure, wherein example 12 also includes the subject matter according to any one of examples 10-11, above.

The monomers at the first set of parameters are a precursor to a first Parylene and wherein the monomers at the second set of parameters are a precursor to a second Parylene, wherein the first Parylene and the second Parylene are a same Parylene. The preceding subject matter of this paragraph characterizes example 13 of the present disclosure, wherein example 13 also includes the subject matter according to any one of examples 10-12, above.

The parameters may be any one of temperature, pressure, residence time, concentration of dimer, amount of dimer, type of dimer, flow rate, or type of material, or a combination thereof. The preceding subject matter of this paragraph characterizes example 14 of the present disclosure, wherein example 14 also includes the subject matter according to any one of examples 10-13, above.

Disclosed herein is a method for depositing Parylene onto a substrate. The method includes operating a first pyrolysis chamber at a first set of parameters to cause cracking of dimers into monomers at the first set of parameters. The method further includes operating a second pyrolysis chamber at a second set of parameters to cause cracking of dimers into monomers at the second set of parameters. The method further includes mixing the monomers at the first set of parameters with monomers at the second set of parameters together after entering a deposition chamber. The method further includes polymerizing the mixture as a protective coating in the deposition chamber. The preceding subject matter of this paragraph characterizes example 15 of the present disclosure.

The monomers at the first set of parameters are a precursor to a first Parylene and wherein the monomers at the second set of parameters are a precursor to a second Parylene. The preceding subject matter of this paragraph characterizes example 16 of the present disclosure, wherein example 16 also includes the subject matter according to example 15, above.

The monomers at the first set of parameters are a precursor to a first Parylene and wherein the monomers at the second set of parameters are a precursor to a second Parylene, wherein the first Parylene and the second Parylene are different Parylenes. The preceding subject matter of this paragraph characterizes example 17 of the present disclosure, wherein example 17 also includes the subject matter according to any one of examples 15-16, above.

The monomers at the first set of parameters are a precursor to a first Parylene and wherein the monomers at the second set of parameters are a precursor to a second Parylene, wherein the first Parylene and the second Parylene are a same Parylene. The preceding subject matter of this paragraph characterizes example 18 of the present disclosure, wherein example 18 also includes the subject matter according to any one of examples 15-17, above.

The parameters may be any one of temperature, pressure, residence time, concentration of dimer, amount of dimer, type of dimer, flow rate, or type of material, or a combination thereof. The preceding subject matter of this paragraph characterizes example 19 of the present disclosure, wherein example 19 also includes the subject matter according to any one of examples 15-18, above.

The first set of parameters includes a longer residence time than the second set of parameters. The preceding subject matter of this paragraph characterizes example 20 of the present disclosure, wherein example 20 also includes the subject matter according to any one of examples 15-19, above.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Figure 1:
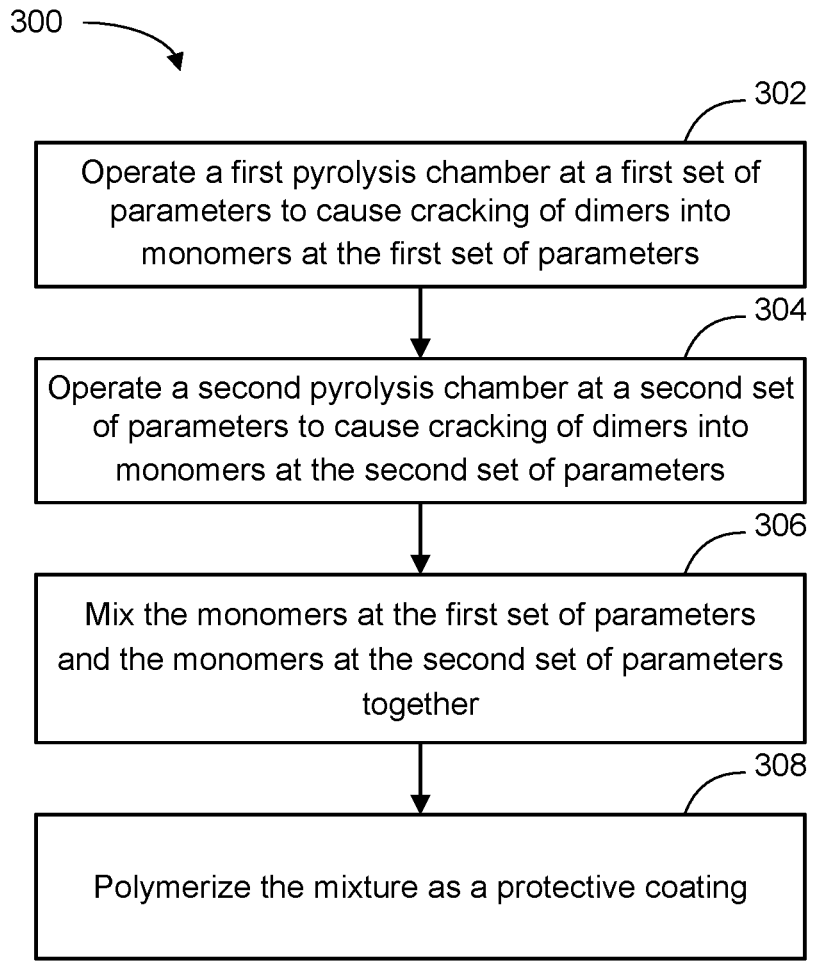
FIG. 1 is a schematic block diagram of a method, according to one or more embodiments of the present disclosure.

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings.

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Moisture resistant coatings or films, as well as other coatings or films are used to protect various parts of electronic devices (or substrates) from external influences. Protective coatings, such as Parylene, are deposited on parts of the electronic devices in deposition chambers. Parylene, and other protective coatings, are deposited on the parts of electronic devices in various methods and processes. Some of those processes, examples of which are described by U.S. Patent Application Publication Nos. 2009/0263581, 2009/0263641, 2009/0304549, 2010/0203347, 2010/0293812, and 2011/0262740, the entire disclosures of each of which are, by this reference, incorporated herein. The disclosures describe embodiments of equipment and/or processes that may be employed to apply a protective coating.

Various types of Parylene exist including Parylene C (poly(chloro-p-xylylene)), Parylene F (which can specifically refer to Parylene-VT4, Parylene-AF4, or any other Parylene with a fluorine atom or atoms in the molecular structure), Parylene N (poly(p-xylylene)), Parylene D (poly(dichloro-p-xylylene)), Parylene A (amino-modified Parylene), etc.

The various types of Parylene have different features, benefits, and drawbacks when compared with each other. For example, the deposition time of Parylene N is significantly longer than the deposition time for Parylene C. The longer deposition time increases manufacturing time and costs. As another example, while Parylene C provides quality water resistance, Parylene C does not provide ultraviolet (UV) protection. While Parylene F provides quality UV protection and high temperature protection, Parylene F is more expensive than Parylene N, as much as thirty-five times more expensive.

Prior to polymerization of monomers to create protective coatings, dimers are cracked to create the monomers in pyrolysis chambers. The pyrolysis chamber heats up the dimer and results in cracking the dimer into monomers by applying energy to the dimers. One difficulty in the cracking process is optimizing the cracking to not produce over-cracking or under-cracking. Over-cracking or under-cracking may result in a milky or opaque protective coating that is noticeable to consumers.

In practical operation, there are difficulties associated with operation of the pyrolysis chamber to achieve and maintain 100% cracking efficiency. Two undesired scenarios may arise, namely "under-cracking" and "over-cracking."

When under-cracking occurs, a mixture of un-cracked dimer and monomer exits the pyrolysis chamber, with the un-cracked dimer quickly condensing onto surfaces between the pyrolysis chamber and the deposition chamber and onto cooler surfaces in the deposition chamber. The heavy dimer deposits that are formed on these surfaces can adversely affect performance of the material deposition equipment, and undesirably increase the frequency with which the material deposition equipment must be cleaned and maintained.

Under-cracking also can result in low dimer utilization, meaning that the polymer coating may be undesirably thin or that the formation of a polymer coating of desired thickness may be undesirably slow. Additionally, when the dimer is not sufficiently cracked by the pyrolysis chamber, dimer may be present within, and contaminate, the polymer coating, which may undesirably affect the quality of the polymer coating.

When over-cracking occurs, the monomer molecules are further dissociated into degraded monomers with lower molecular weights, as well unwanted products such as chlorine gas ($Cl_2$). Chlorine gas and moisture can readily form hydrochloric acid (HCl), which can corrode the surfaces of the material deposition equipment that the hydrochloric acid contacts. In addition, degraded monomers may deposit onto surfaces of the material deposition equipment, which can adversely affect its performance and undesirably increase the frequency with which the equipment must be cleaned and maintained.

In practical operation, there are difficulties and challenges that are associated with the operation of a pyrolysis chamber to achieve and maintain cracking efficiency. In order to achieve efficient cracking, many measurements may be needed, and adjustments can be made to optimal temperature and residence time. Taking precise measurements and determining optimal residence time may be costly and resource intensive. Complicated formulas may be needed to figure out how to achieve efficient cracking. Embodiments described herein provide an ability to achieve efficiency through a mixture of material produced in two different pyrolysis chambers that at two different parameters. As examples, the parameters may relate to temperature, pressure, residence time, concentration of dimer, amount of dimer, type of dimer, flow rate, or type of material, etc. In some embodiments, the temperatures in each pyrolysis chamber may differ. In some embodiments, the pressure in each pyrolysis chamber may differ. In some embodiments, the residence time in each pyrolysis chamber may differ. In some embodiments, the concentration of dimer in each pyrolysis chamber may differ. In some embodiments, the type of dimer in each pyrolysis chamber may differ. In some embodiments, the type of material in each pyrolysis chamber may differ.

In some embodiments, the mixing of the monomers that are produced at two different temperatures can aid in cracking efficiency. In some embodiments, such mixture may aid in additional cracking which may occur in a separate location in between the pyrolysis chamber and the deposition chamber.

In some embodiments, the amount of material in the first pyrolysis chamber and the amount of material in the second pyrolysis chamber may be adjusted to allow for the optimal amount of mixture of material. In some embodiments, this may be accomplished by mixing more material at the higher temperature with less material at the lower temperature. That is, more dimer is fed into the first pyrolysis chamber that is at a higher temperature than dimer that is fed into the second pyrolysis chamber that is at a lower relative temperature.

In other embodiments, more dimer may be fed into the second pyrolysis chamber that is at a lower relative temperature than dimer that is fed into the first pyrolysis chamber that is at a higher temperature.

Embodiments described herein utilize two (or more) pyrolysis chambers in parallel. In the first pyrolysis chamber, the dimers are subjected to first set of parameters. In the second pyrolysis chamber, the dimers are subject to a second set of parameters. The two feeds of monomers created by the first set of parameters and the monomers created by the second set of parameters are then both fed into the deposition chamber. The monomers of the first pyrolysis chamber may compensate for the monomers of the second pyrolysis chamber to create an efficient mixture.

While providing a single pyrolysis chamber in which monomers are created by a single set of parameters may be difficult, combining one feed of monomers at a first set of parameters with a feed of monomers created at a second set of parameters allows for the complementary feeds to complement each other and produce more efficient cracking and result in a better coating.

In some embodiments, the feed of the first pyrolysis chamber is joined to the feed of the second pyrolysis chamber prior to entering the deposition chamber. In such embodiments, the two feeds are mixed prior to entering the deposition chamber. In some embodiments, the monomers of the first pyrolysis chamber and the monomers of the second pyrolysis chamber are separately fed into the deposition chamber. In such embodiments, the monomers of the first pyrolysis chamber and the monomers of the second pyrolysis chamber are mixed after entering the deposition chamber.

In some embodiments, the first pyrolysis chamber and the second pyrolysis chamber are operated at different temperatures. That is, cracking occurs in the first pyrolysis chamber at a first temperature and in the second pyrolysis chamber at a second temperature. By controlling the operating temperatures of the pyrolysis chambers, different cracking efficiencies and different cracking rates may occur in the two pyrolysis chambers.

In some embodiments, the system includes parallel pyrolysis chambers. In some embodiments, the system further includes parallel vaporization chambers (or sublimation zones) connected in series to the pyrolysis chambers. In other embodiments, the separate pyrolysis chambers are fed by a single vaporization chamber.

A method is disclosed. The method includes heating a first pyrolysis chamber to a first temperature to cause cracking of dimers into monomers at the first temperature and heating a second pyrolysis chamber to a second temperature to cause cracking of dimers into monomers at the second temperature. The method includes mixing the monomers at the first temperature and the monomers at the second temperature. The method also may include polymerizing the mixture as a protective coating onto substrates. The method then ends.

In some embodiments, the monomers of the first pyrolysis chamber and the monomers of the second pyrolysis chamber are mixed prior to entering a deposition chamber. In some embodiments, the monomers of the first pyrolysis chamber and the monomers of the second pyrolysis chamber are mixed in chamber. In some embodiments, the monomers of the first pyrolysis chamber and the monomers of the second pyrolysis chamber are mixed in a conduit that leads to the deposition chamber. In some embodiments, the monomers of the first pyrolysis chamber and the monomers of the second pyrolysis chamber are mixed within the deposition chamber.

Some embodiments described herein include a method. In some embodiments, the method is for depositing Parylene onto a substrate. In some embodiments, the method includes operating a first pyrolysis chamber at a first pressure to cause cracking of dimers into monomers at the first pressure. In some embodiments, the method further includes operating a second pyrolysis chamber at a second pressure to cause cracking of dimers into monomers at the second pressure.

In some embodiments, the method further includes mixing monomers of the first pyrolysis chamber and the monomers of the second pyrolysis chamber. In some embodiments, the method further includes polymerizing the mixture as a protective coating onto a substrate.

Some embodiments described herein include a method. In some embodiments, the method is for depositing Parylene onto a substrate. In some embodiments, the method includes operating a first pyrolysis chamber for a length of a first residence time to cause cracking of dimers into monomers at the first residence time. In some embodiments, the method further includes operating a second pyrolysis chamber for a length of a second residence time to cause cracking of dimers into monomers at the second residence time. The method further includes mixing monomers of the first pyrolysis chamber and the monomers of the second pyrolysis chamber. The method further includes polymerizing the mixture as a protective coating onto a substrate.

Some embodiments described herein include a method. In some embodiments, the method is for depositing Parylene onto a substrate. In some embodiments, the method includes operating a first pyrolysis chamber with a first concentration of dimer to cause cracking of dimers into monomers at the first concentration. In some embodiments, the method further includes operating a second pyrolysis chamber with a second concentration of dimer to cause cracking of dimers into monomers at the second concentration. The method further includes mixing monomers of the first pyrolysis chamber and the monomers of the second pyrolysis chamber. The method further includes polymerizing the mixture as a protective coating onto a substrate.

Some embodiments described herein include a method. In some embodiments, the method is for depositing Parylene onto a substrate. In some embodiments, the method includes operating a first pyrolysis chamber with a first amount of dimer to cause cracking of dimers into monomers at the first amount. In some embodiments, the method further includes operating a second pyrolysis chamber with a second amount of dimer to cause cracking of dimers into monomers at the second amount. The method further includes mixing monomers of the first pyrolysis chamber and the monomers of the second pyrolysis chamber. The method further includes polymerizing the mixture as a protective coating onto a substrate.

Some embodiments described herein include a method. In some embodiments, the method is for depositing Parylene onto a substrate. In some embodiments, the method includes operating a first pyrolysis chamber with a first type of dimer to cause cracking of dimers into monomers. In some embodiments, the method further includes operating a second pyrolysis chamber with a second type of dimer to cause cracking of dimers into monomers. The method further includes mixing monomers of the first pyrolysis chamber and the monomers of the second pyrolysis chamber. The method further includes polymerizing the mixture as a protective coating onto a substrate.

Some embodiments described herein include a method. In some embodiments, the method is for depositing Parylene onto a substrate. In some embodiments, the method includes operating a first pyrolysis chamber with a first amount of dimer to cause cracking of dimers into monomers at the first amount. In some embodiments, the method further includes operating a heated chamber with a second material to activate a precursor. The method further includes mixing the monomers of the first pyrolysis chamber and the activated precursor of the heated chamber. The method further includes polymerizing the mixture as a protective coating onto a substrate.

In some embodiments, the method further includes mixing before entering a deposition chamber. In some embodiments, the mixing causes the different materials to aid in efficient cracking prior to entering the deposition chamber.

In some embodiments, the method further includes mixing the monomers after entering a deposition chamber. In some embodiments, the mixing causes efficient cracking after entering the deposition chamber.

In some embodiments, the monomers from the first pyrolysis chamber are a precursor to a first Parylene and the monomers from the second pyrolysis chamber are a precursor to a second Parylene. In some embodiments, the monomers from the first pyrolysis chamber are a precursor to a first Parylene and the monomers from the second pyrolysis chamber are a precursor to a second Parylene, the first Parylene and the second Parylene being different Parylenes.

In some embodiments, the monomers from the first pyrolysis chamber are a precursor to a first Parylene and the monomers from the second pyrolysis chamber are a precursor to a second Parylene, the first Parylene and the second Parylene being the same Parylene.

FIG. 1 depicts a flow chart diagram of a method 300 for depositing Parylene onto a substrate as described and shown herein. Although the method 300 is described in conjunction with the system described above, embodiments of the method 300 may be implemented with other types of systems.

At block 302, a first pyrolysis chamber is operated at a first set of parameters to cause cracking of dimers into monomers at the first set of parameters. In context, the first pyrolysis chamber can include a roughly higher temperature or residence time etc. By not needing to precisely control the efficiency within the first pyrolysis chamber, less stringent controls and measurements are needed.

At block 304, a second pyrolysis chamber is operated at a second set of parameters to cause cracking of dimers into monomers at the second set of parameters. In this context, the second pyrolysis chamber can include a roughly lower temperature or shorter residence time etc. By not needing to precisely control the efficiency with the second pyrolysis chamber, less stringent controls and measurements are needed.

At block 306, the monomers at the first temperature and the monomers at the second temperature are mixed together. At block 308, the mixture is polymerized as a protective coating. The method then ends.

Figure 2:
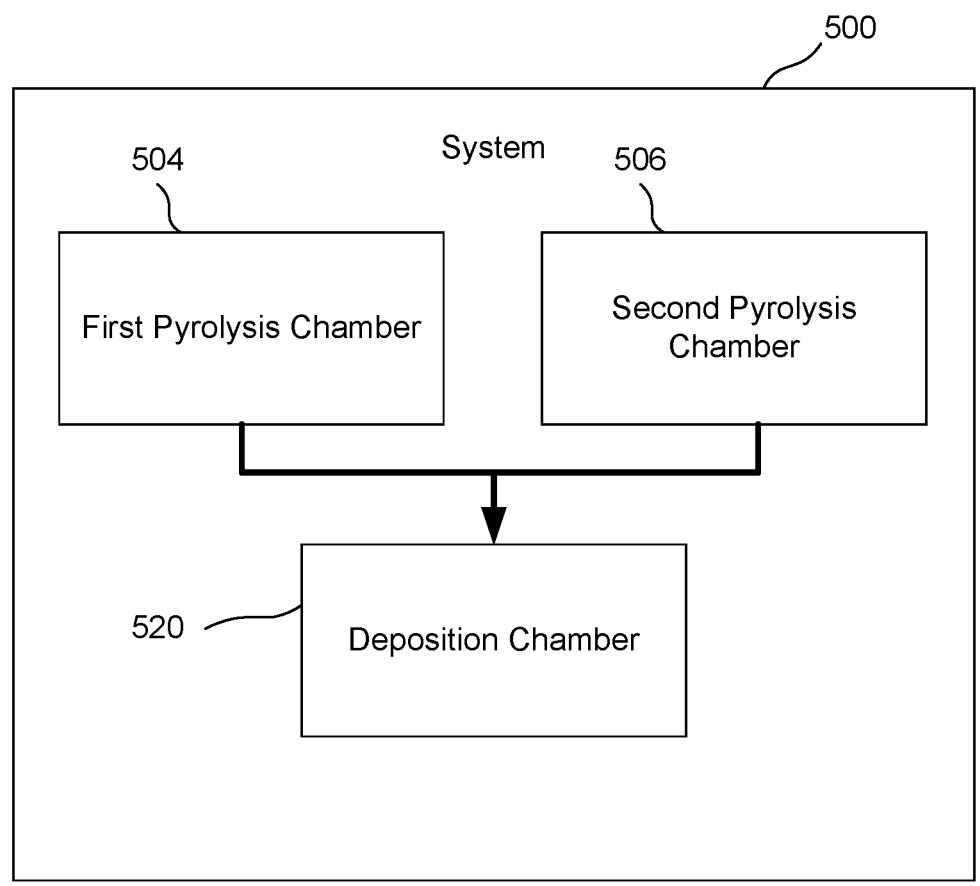
FIG. 2 is a schematic diagram of a dual reactor system, according to one or more embodiments of the present disclosure.

Referring to FIG. 2, a system 500 includes a first pyrolysis chamber 504 and a second pyrolysis chamber 506. The first pyrolysis chamber 504 and the second pyrolysis chamber 506 are operated in parallel and mix the contents prior to entering the deposition chamber 520. In other embodiments, the contents are mixed after entering the deposition chamber 520. The first pyrolysis chamber 504 and the second pyrolysis chamber 506 may be operated at any of a number of different parameters. As examples, the parameters may relate to temperature, pressure, residence time, concentration of dimer, amount of dimer, type of dimer, flow rate, or type of material, etc. In some embodiments, a single parameter is different between the first pyrolysis chamber 504 and the second pyrolysis chamber 506. In other embodiments, multiple parameters are different between the first pyrolysis chamber 504 and the second pyrolysis chamber 506. Any number of combinations are possible.

In some embodiments, the second pyrolysis chamber allows the use of different materials that have different sublimation or evaporation temperatures. In one implementation, the first pyrolysis chamber 504 may include a Parylene and the second pyrolysis chamber 506 may include an acrylate. The Parylene and the acrylate may be fed at different temperatures and are co-polymerized in the deposition chamber 520. Other materials are envisioned in combination with Parylene.

In some embodiments, the system allows for continuous deposition as one of the pyrolysis chambers may be reloaded while the other is running. The use of dual reactors (that still could be running different materials) allows for a more continuous operation as the evaporation/sublimation/pyrolysis is continued on in the other pyrolysis chamber while reloading or working on the other pyrolysis chamber.

Figure 3:
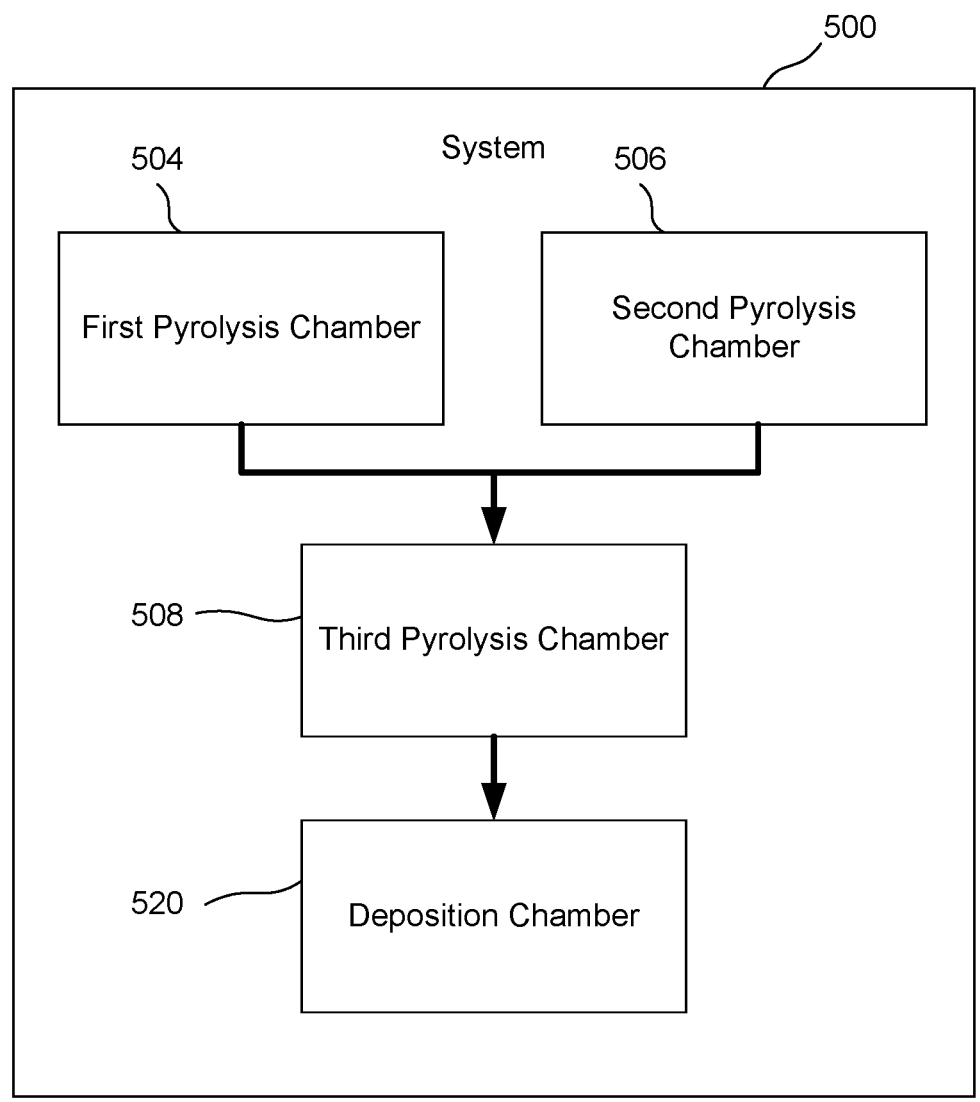
FIG. 3 is a schematic diagram of a system, according to one or more embodiments of the present disclosure.

Some embodiments may include three pyrolysis chambers. Referring to FIG. 3, a system 500 includes a first pyrolysis chamber 504, a second pyrolysis chamber 506, and a third pyrolysis chamber 508. A first batch of dimer is over-cracked in the first pyrolysis chamber 504. Another batch of dimer is under-cracked in the second pyrolysis chamber 506. The batches are then combined in the third pyrolysis chamber 508, in which the over-cracked monomer from the first pyrolysis chamber 504 assists in cracking the under-cracked dimer from the second pyrolysis chamber 506, which is then transported into the deposition chamber 520.

Figure 4:
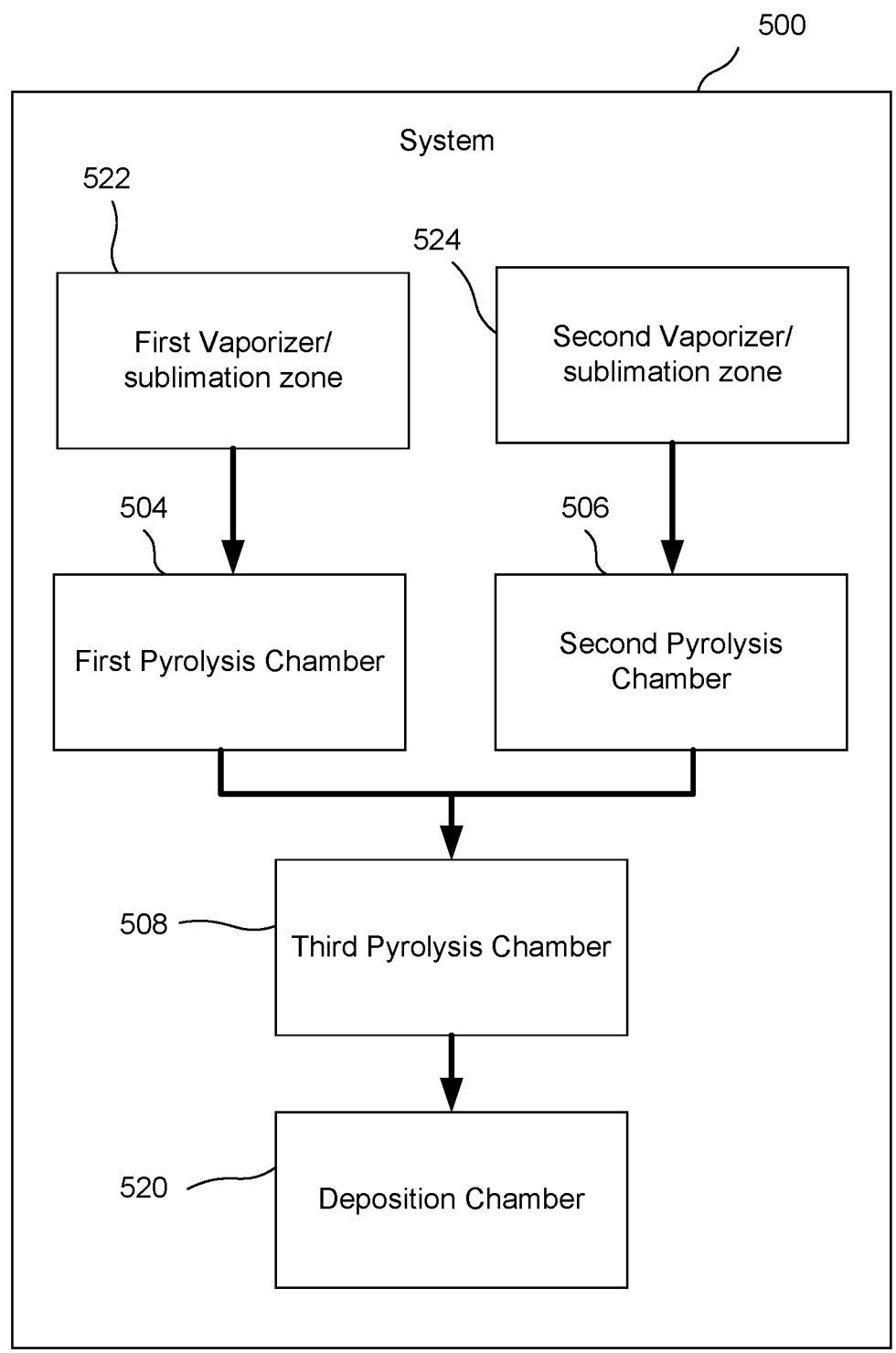
FIG. 4 is a schematic diagram of another system, according to one or more embodiments of the present disclosure.

Referring now to FIG. 4, the system 500 is similar to the system 500 of FIG. 3. The system 500 of FIG. 4 includes a first vaporizer 522 and a second vaporizer 524. In alternatives, they may be sublimation zones. The first and second vaporizers are operated in parallel with the first and second pyrolysis chambers and may allow for a first and second set of parameters for the vaporizers as well.

The two (or three) chambers allow the pressure, temperature, and flow rate to balance in all two or three chambers, with a key benefit of avoiding poor reaction products at the various stages including sublimation, cracking, and polymerization. The use of dual reactors also provides the ability have rate limited reactions in the pyrolysis chambers and material limited reactions in the deposition chamber. Further, such ability allows for one to flow material slowly through the pyrolizer to get good reactants, but react faster once they enter the deposition chamber, a reaction faster than the slow feed would allow with a single pyrolysis chamber. Two sources of monomers or materials allows for the deposition to proceed more quickly.

In some embodiments, the system may also include multiple deposition chambers. In such embodiments, the system may include a multitude of vaporization chambers, pyrolysis chambers, and deposition chambers. In conjunction with bypass apparatuses, the system is capable to direct product in any combination of vaporization chamber, pyrolysis chamber, deposition chamber to allow for the ability to load or clean one deposition chamber while the other is continuing to run. The bypass apparatus may also allow for bypass of the deposition chamber entirely which may allow for the delivery of only optimal reaction products to the deposition chamber. Sub-optimal reaction products can be identified and bypassed around the deposition chamber.

Figure 5:
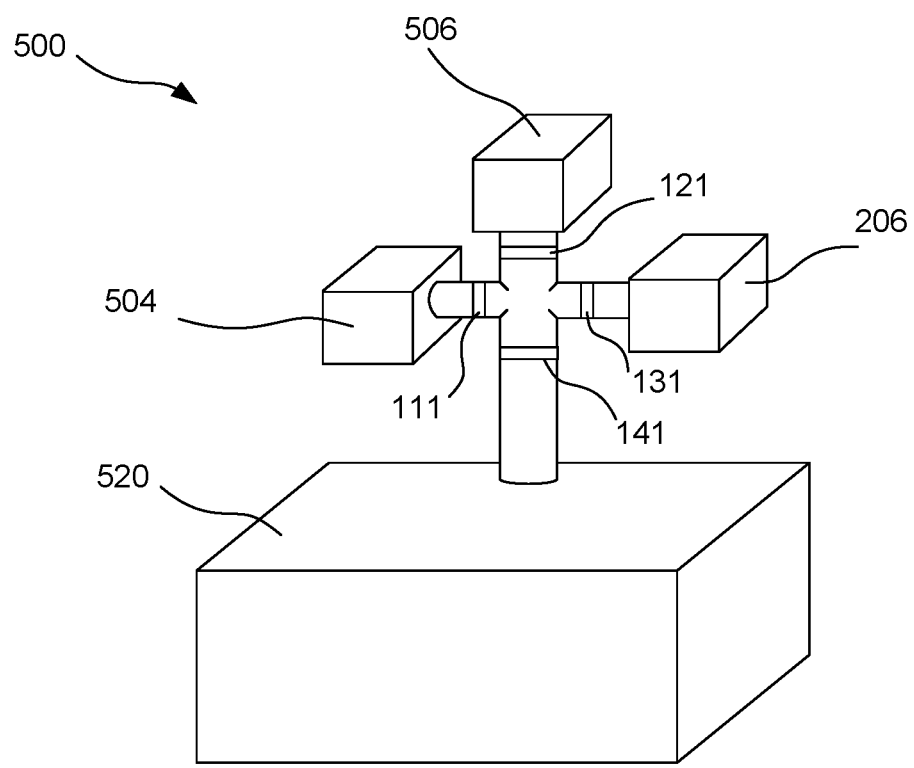
FIG. 5 is a schematic diagram of a dual reactor system, according to one or more embodiments of the present disclosure.

Referring to FIG. 5, a schematic diagram of a dual reactor system 500 is shown. Although the system 500 is shown and described with certain components and functionality in the following paragraphs, other embodiments of the system 500 may include fewer or more components to implement less or more functionality.

The system 500 is configured to deposit a coating or film on a substrate or a plurality of substrates. The system 500 may utilize various components (not all necessary) to accomplish the deposition on the substrate(s). Substrate may refer generally to PCBs, PCBAs, electronic components, electronic devices, etc. In some embodiments, the system 500 utilizes a plurality of pyrolysis chambers 504, 506 to deposit one or more different coatings. This may be accomplished by utilizing more than one pyrolysis chambers at different operating parameters.

Referring to FIG. 5, the system 500 includes a first pyrolysis chamber 504, a second pyrolysis chamber 506, each used for cracking of dimer, potentially at different parameters, and a mixing chamber 206. The system 500 includes a deposition chamber 520, which may include a vacuum, pumps, cooling mechanism(s), heating mechanisms, controller(s)/processor(s), temperature/pressure gauge(s) (which encompasses various monitoring equipment to record accurate properties of the system 500.

In the illustrated embodiment, the monomers created in each of the pyrolysis chambers is mixed before entering the deposition chamber 520. This may occur in a piping system or in a separate chamber such as the mixing chamber 206. The monomer developed in each of the pyrolysis chambers may be directed into the mixing chamber 206 by utilizing valves 111, 121, and 131. After mixing occurs, the valves 111 and 121 may be closed and the valve 141 may be opened to draw the now mixed monomers in the mixing chamber 206 into the deposition chamber 520.

Figure 6:
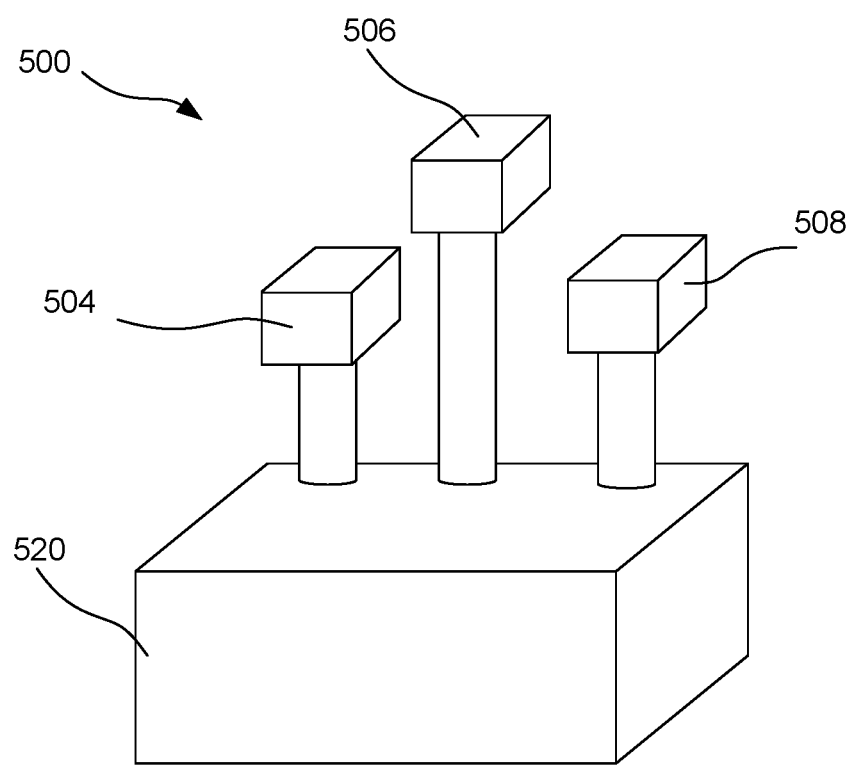
FIG. 6 is a schematic diagram of a dual reactor system, according to one or more embodiments of the present disclosure.

Referring to FIG. 6, a schematic diagram of a multi reactor system 500 is shown. Although the system 500 is shown and described with certain components and functionality in the following paragraphs, other embodiments of the system 500 may include fewer or more components to implement less or more functionality.

The system 500 is configured to deposit a coating or film on a substrate or a plurality of substrates. The system 500 may utilize various components (not all necessary) to accomplish the deposition on the substrate(s). Substrate may refer generally to PCBs, PCBAs, electronic components, electronic devices, etc. In some embodiments, the system 500 utilizes a plurality of pyrolysis chambers 504, 506, 508 to deposit one or more different coatings. This may be accomplished by utilizing more than one pyrolysis chambers at different operating parameters.

Referring to FIG. 6, the system 500 includes a first pyrolysis chamber 504, a second pyrolysis chamber 506, and a third pyrolysis chamber 508 each used for cracking of dimer, potentially at different parameters. The system 500 includes a deposition chamber 520, which may include a vacuum, pumps, cooling mechanism(s), heating mechanisms, controller(s)/processor(s), temperature/pressure gauge(s) (which encompasses various monitoring equipment to record accurate properties of the system 100.

In the illustrated embodiment, the monomers created in each of the pyrolysis chambers is mixed after entering the deposition chamber 520. The monomer developed in each of the pyrolysis chambers may be directed into the deposition chamber 520 at various speeds and times to allow for the mixing of the monomers in the deposition chamber 520.

Referring to the many embodiments described herein, the embodiments may be combined with features of one embodiment utilized in another embodiment even without the specific description herein.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

Reference throughout this specification to features, advantages, or similar language does not imply that all of the features and advantages that may be realized with the subject matter of the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification.

For purposes of this disclosure, a system, apparatus, structure, article, element, component, or hardware described as being "configured to" perform a particular function may additionally or alternatively be described as being "adapted to" and/or as being "operative to" perform that function.

The present subject matter may be embodied in other specific forms without departing from its spirit or essential characteristics. The described embodiments are to be considered in all respects only as illustrative and not restrictive.

What is claimed:

1. A method for depositing Parylene onto a substrate, comprising:

operating a first pyrolysis chamber at a first set of parameters to cause cracking of dimers into monomers at the first set of parameters, wherein the monomers at the first set of parameters are a precursor to a first Parylene;

operating a second pyrolysis chamber at a second set of parameters to cause cracking of dimers into monomers at the second set of parameters, wherein the monomers at the second set of parameters are a precursor to a second Parylene, wherein the first Parylene and the second Parylene are a same Parylene, wherein the first set of parameters includes a longer residence time than the second set of parameters, and wherein the first set of parameters includes a lower temperature than the second set of parameters;

mixing the monomers at the first set of parameters with monomers at the second set of parameters together in a third pyrolysis chamber before entering a deposition chamber, wherein, within the third pyrolysis chamber, over-cracked monomer from the first pyrolysis chamber assists in cracking under-cracked dimer from the second pyrolysis chamber; and polymerizing the mixture as a protective coating in the deposition chamber.

2. The method of claim 1, wherein the parameters further include pressure, concentration of dimer, amount of dimer, type of dimer, flow rate, or type of material, or a combination thereof.

3. A method for depositing Parylene onto a substrate, comprising:

operating a first pyrolysis chamber at a first set of parameters to cause cracking of dimers into monomers at the first set of parameters;

operating a second pyrolysis chamber at a second set of parameters to cause cracking of dimers into monomers at the second set of parameters, wherein the first set of parameters includes a longer residence time than the second set of parameters, and wherein the first set of parameters includes a lower temperature than the second set of parameters;

mixing the monomers at the first set of parameters with monomers at the second set of parameters together in a third pyrolysis chamber before entering a deposition chamber, wherein, within the third pyrolysis chamber, over-cracked monomer from the first pyrolysis chamber assists in cracking under-cracked dimer from the second pyrolysis chamber; and polymerizing the mixture as a protective coating in the deposition chamber.

4. The method of claim 3, wherein the monomers at the first set of parameters are a precursor to a first Parylene and wherein the monomers at the second set of parameters are a precursor to a second Parylene.

5. The method of claim 3, wherein the monomers at the first set of parameters are a precursor to a first Parylene and wherein the monomers at the second set of parameters are a precursor to a second Parylene, wherein the first Parylene and the second Parylene are a same Parylene.

6. The method of claim 3, wherein the parameters further include pressure, concentration of dimer, amount of dimer, type of dimer, flow rate, or type of material, or a combination thereof.

* * * * *